United States Patent [19]

Takeuchi et al.

[11] Patent Number: 4,628,223
[45] Date of Patent: Dec. 9, 1986

[54] COMPOSITE CERAMIC/POLYMER PIEZOELECTRIC MATERIAL

[75] Inventors: Hiroshi Takeuchi, Matsudo; Chitose Nakaya, Tokyo; Shinichiro Umemura, Hachioji; Kageyoshi Katakura, Tokyo, all of Japan

[73] Assignees: Hitachi, Ltd.; Hitachi Medical Corporation, both of Tokyo, Japan

[21] Appl. No.: 662,098

[22] Filed: Oct. 18, 1984

[30] Foreign Application Priority Data

Oct. 19, 1983 [JP] Japan ................... 58-194233

[51] Int. Cl.⁴ ............................................ H01L 41/08
[52] U.S. Cl. ..................................... 310/358; 310/334; 310/800
[58] Field of Search .................. 310/357–359, 310/800, 334–337

[56] References Cited

U.S. PATENT DOCUMENTS

| | | | |
|---|---|---|---|
| 4,211,948 | 7/1980 | Smith et al. | 310/334 X |
| 4,217,684 | 8/1980 | Brisken | 310/334 X |
| 4,233,477 | 11/1980 | Rice et al. | 310/334 X |
| 4,366,406 | 12/1982 | Smith et al. | 310/334 |
| 4,407,054 | 10/1983 | Zipfel, Jr. | 310/358 X |
| 4,412,148 | 10/1983 | Klicker et al. | 310/357 X |
| 4,422,003 | 12/1983 | Safari et al. | 310/358 |
| 4,473,769 | 9/1984 | Nguyen | 310/334 |

Primary Examiner—Mark O. Budd
Attorney, Agent, or Firm—Antonelli, Terry & Wands

[57] ABSTRACT

A high-sensitivity ultrasonic probe comprising a plate of a composite material having the regions of a piezoelectric ceramic polarized uniformly in the direction of thickness and the regions of polymer, both regions existing dispersed alternately in the direction parallel to the plate surface, electrodes formed on both sides of the composite material, and a connecting layer formed on at least one side of the composite material and composed of a material harder than said polymer.

3 Claims, 3 Drawing Figures

COMPOSITE CERAMIC/POLYMER PIEZOELECTRIC MATERIAL

BACKGROUND OF THE INVENTION

This invention relates to an ultrasonic probe for use in an ultrasonic diagnostic apparatus and the like.

In application of an ultrasonic probe to medical uses, it is desirable that the piezoelectric member functioning as an electro-ultrasonic converter is composed of a material which not only has a large electro-ultrasonic conversion efficiency, in other words, a large electromechanical coupling coefficient, but is also soft and small in acoustic impedance. However, the inorganic materials with a large electro-mechanical coupling coefficient such as lead zirconate titanate (PZT) type ceramics are hard and high in acoustic impedance and have poor adaptability to the human body. On the other hand, the soft materials such as polymer have no piezoelectric property, or if they have piezoelectric property, they are small in electro-mechanical coupling coefficient. In order to overcome such dilemma, many attempts have been made recently for combining an inorganic material such as PZT ceramic and polymer to produce a composite material which possesses advantages of said both types of material. A pioneer study of this line has been done by Newnham et al of U.S., and the utility of such composite material is described in, for instance, Material Research Bulletin, Vol. 13, pp. 525–536. Various methods have been deviced for compounding of PZT ceramic and polymer. For instance, usefulness of a composite honeycomb structure illustrated in FIG. 1 of the accompanying drawings is disclosed in Material Research Bulletin, Vol. 15, pp. 1371–1379. The composite piezoelectric material 11 shown there comprises a honeycomb structure of PZT ceramic having a plurality of cavities 12 filled with polymer, and it is stated that the performance index of this composite piezoelectric material 11 in use for a hydrophone far excels that of PZT ceramic itself.

There have been also proposed the composite piezoelectric materials of a structure in which a plurality of columnar piezoelectric bodies are embedded in a plate of polymer having a uniform thickness. This type of composite piezoelectric materials have the same effect as the above-said type of composite material (shown in FIG. 1).

The present invention is an adaptation of a composite piezoelectric material such as mentioned above to an ultrasonic probe which receives and transmits ultrasonic waves. A prominent advantage of such composite piezoelectric material is that this material can be reduced in accoustic impedance and dielectric constant without lowering the piezoelectric strain constant (d constant) which has direct relation to the ultrasonic wave generation efficiency. This, however, is based on the supposition that (I) the piezoelectric ceramic existing dispersedly in the composite material is free of any lateral mechanical coupling, and (II) the whole composite piezoelectric material can be displaced uniformly in the thicknesswise direction.

In use of a composite piezoelectric material for an ultrasonic probe, the condition of (II) is especially important for the proper formation of beams. The two conditions, however, conflict with each other: for meeting the condition (I), the polymer must be soft, but the soft polymer can not fulfill the condition (II), that is, the polymer is required to be hard (to certain extent) for allowing a uniform displacement of the whole composite piezoelectric material in its thicknesswise direction.

SUMMARY OF THE INVENTION

An object of this invention is to provide an ultrasonic probe characterized by the use of a composite piezoelectric material which can meet said both conditions (I) and (II).

Another object of this invention is to provide an ultrasonic probe having a higher sensitivity than the conventional ultrasonic probes.

According to this invention, there is provided an ultrasonic probe comprising a plate of a composite piezoelectric material having the regions of a piezoelectric ceramic polarized uniformly in the thicknesswise direction and the regions of polymer, said both regions existing in the thicknesswise direction and being dispersed alternately in the direction parallel to the plate surface, electrodes formed on both sides of said composite piezoelectric material, and a connecting layer formed on at least one side of said composite piezoelectric material and composed of a material harder than said polymer. This construction can provide a high-sensitivity ultrasonic probe which makes the best use of the advantages of composite piezoelectric material.

DETAILED DESCRIPTION OF THE INVENTION

The ultrasonic probe according to this invention uses a composite piezoelectric material having the regions of a piezoelectric ceramic and the regions of polymer, both of said regions being arranged alternately in the plate surface of said material, and is further characterized by the provision of a connecting layer which acts as an intermediary for said both regions for allowing their interrelated operation.

The connecting layer is formed on at least one side of the composite piezoelectric material, and it is important that this layer is greater in hardness, that is, higher in modulus of elasticity than the polymer. More specifically, said connecting layer has a modulus of elasticity in the range of $0.4 \times 10^{10}$ to $1.3 \times 10^{10}$ N/m$^2$, preferably $0.5 \times 10^{10}$ to $1.0 \times 10^{10}$ N/m$^2$. If the hardness of the connecting layer is larger than this range, the electromechanical factor become decreased due to mechanical coupling between the regions of ceramic.

It is suggested that the connecting layer has a thickness which is about one fourth of the ultrasonic wavelength because in this case the connecting layer gives no load when ultrasonic waves are emitted, thus improving the beam generation efficiency. It is also possible to let the connecting layer play the role of an accoustic matching layer by using a material whose accoustic impedance is intermediate between those of water and composite piezoelectric material.

An epoxy resin with a relatively high hardness, having a modulus of elasticity in the range of $0.5 \times 10^{10}$ to $1.0 \times 10^{10}$ N/m², is preferably used for the connecting layer.

As the piezoelectric ceramic in the composite piezoelectric material, lead zirconate titanatey type (PZT) ceramics and lead titanate type ceramics can be used, the former being preferred.

As for the polymer in the composite piezoelectric material, it is recommended to use silicone rubber, polyurethane or epoxy resin having a modulus of elasticity in the range of $0.1 \times 10^{10}$ to $0.4 \times 10^{10}$ N/m². Silicone rubber and polyurethane, are most preferred.

PREFERRED EMBODIMENTS OF THE INVENTION

The present invention will be described in further detail below by way of the embodiments thereof, which embodiments are however not to be taken as limiting the scope of the invention.

Figure 1:
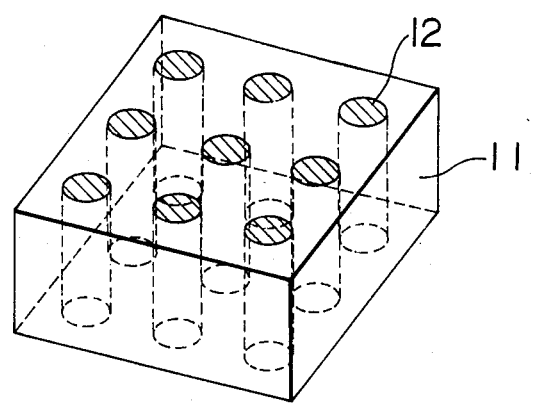
FIG. 1 is an illustration showing the structural concept of a conventional composite piezoelectric material on which the present invention is based.
Figure 2:
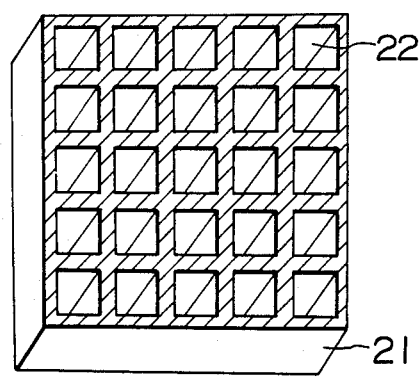
FIG. 2 is an illustration showing a piezoelectric ceramic honeycomb structure used in an embodiment of this invention.

There was prepared a 10 mm × 10 mm × 0.6 mm thick PZT ceramic structure polarized uniformly in the thicknesswise direction, and as shown in FIG. 2, there were formed in this PZT ceramic structure 25 holes 22, each being 1.5 mm square, at the intervals of 0.5 mm by ultrasonic drilling. After filling the holes with silicone rubber (modulus of elasticity: $0.15 \times 10^{10}$ N/m²), chromium and gold were deposited on both sides of the structure to form electrodes. Soft silicone rubber was used as filler to keep free of any lateral mechanical coupling of the PZT ceramic particles. The thus obtained composite piezoelectric material 21 showed an acoustic impedance of up to $9 \times 10^6$ kg/m²s.

Figure 3:
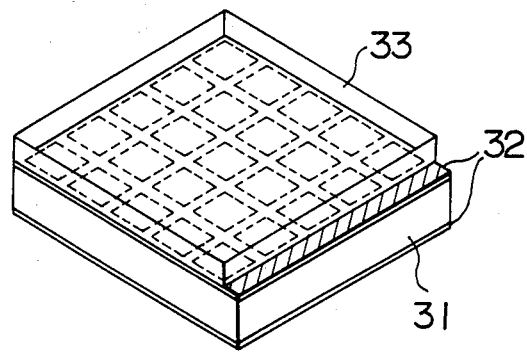
FIG. 3 is an illustration showing an ultrasonic probe according to this invention.

A relatively hard epoxy resin having an acoustic impedance of about $3 \times 10^6$ kg/m²s was used as the polymer and as shown in FIG. 3, this resin was applied on the composite piezoelectric material 31 as an acoustic connecting layer 33 for said PZT ceramic portions and silicone rubber portions. The thickness of this acoustic connecting layer was 0.13 mm at most. Numeral 32 indicates electrodes. The upper electrode is partly bared out for connecting a lead wire for supplying an electric current. The thickness of the connecting layer 33 is approximately one fourth of the ultrasonic wavelength in this embodiment of the invention.

For examining the performance of the thus produced ultrasonic probe, the pulse waveform and sensitivity were determined. Air backing was used as an acoustic test condition. Ultrasonic waves were emitted from the probe into water and the echor from the reflector was received by the probe, and the comprehensive transmitting and receiving sensitivity was evaluated. Although air backing was used, $-20$ dB pulse width was approximately 4.5λ (λ being ultrasonic wavelength), which is sufficiently short for ultrasonic imaging. By way of comparison, there was prepared an ultrasonic probe of a conventional structure using PZT ceramic and having the same caliber (10 mm square). In this comparative probe, a suitable backing was combined with the acoustic matching layer so that the pulse length would become substantially the same ($-20$ dB width is 4.5λ) as that of the probe of this invention (in the shown embodiment). Both probes were subjected to the sensitivity evaluation test. As a result, the probe of this invention showed about 15 dB higher sensitivity than the comparative probe.

From the foregoing, it is apparent that a high-sensitivity ultrasonic probe can be realized by a combination of a composite material comprising a piezoelectric ceramic and polymer and an acoustic connecting layer.

What is claimed is:

1. An ultrasonic probe comprising a plate of a composite piezoelectric material having a region of piezoelectric ceramic polarized uniformly in a thicknesswise direction and a region of polymer, both said regions existing along the thicknesswise direction and being dispersed alternately in a direction parallel to a major plate surface, electrodes formed on each major plate surface of said plate of the composite piezoelectric material, and an acoustic connecting layer formed on at least one major plate surface of said plate of the composite piezoelectric material composed of a material harder than said polymer and having a modulus of elasticity in the range of $0.4 \times 10^{10}$ to $1.3 \times 10^{10}$ N/m².

2. An ultrasonic probe according to claim 1, wherein said piezoelectric ceramic is a lead zirconate titanate type ceramic, said polymer is silicone rubber or polyurethane, and said connecting layer is comprised of an epoxy resin having a modulus of elasticity in the range of $0.5 \times 10^{10}$ to $1.0 \times 10^{10}$ N/m².

3. An ultrasonic claim according to claim 2, wherein said electrodes are comprised of metals.

* * * * *